US008807550B2

(12) United States Patent
Lowe et al.

(10) Patent No.: US 8,807,550 B2
(45) Date of Patent: Aug. 19, 2014

(54) METHOD AND APPARATUS FOR CONTROLLING FORCE BETWEEN REACTOR AND SUBSTRATE

(75) Inventors: Jeffrey Chih-Hou Lowe, Cupertino, CA (US); Sandeep Mariserla, Danbury, CT (US); Robert Sculac, Lake Oswego, OR (US)

(73) Assignee: Intermolecular, Inc., San Jose, CA (US)

( * ) Notice: Subject to any disclaimer, the term of this patent is extended or adjusted under 35 U.S.C. 154(b) by 381 days.

(21) Appl. No.: 13/324,732

(22) Filed: Dec. 13, 2011

(65) Prior Publication Data
US 2013/0149077 A1 Jun. 13, 2013

(51) Int. Cl.
*B23Q 1/00* (2006.01)

(52) U.S. Cl.
USPC .............................. 269/58; 269/21

(58) Field of Classification Search
USPC ............. 269/58, 21, 900, 903, 289 R, 56, 55; 29/559; 451/388; 279/3
See application file for complete search history.

(56) References Cited

U.S. PATENT DOCUMENTS

| | | | | |
|---|---|---|---|---|
| 3,422,320 A | * | 1/1969 | Woodling | 257/710 |
| 3,659,552 A | * | 5/1972 | Briody | 118/725 |
| 3,711,081 A | * | 1/1973 | Cachon | 269/21 |
| 4,723,766 A | * | 2/1988 | Beeding | 269/21 |
| 5,191,218 A | * | 3/1993 | Mori et al. | 250/453.11 |
| 7,144,056 B2 | * | 12/2006 | Casarotti et al. | 294/186 |
| 7,544,574 B2 | * | 6/2009 | Chiang et al. | 438/297 |
| 7,607,647 B2 | * | 10/2009 | Zhao et al. | 269/21 |
| 2002/0037645 A1 | * | 3/2002 | Matsunaga et al. | 438/680 |
| 2007/0082508 A1 | * | 4/2007 | Chiang et al. | 438/800 |
| 2009/0109250 A1 | * | 4/2009 | Johnston et al. | 347/4 |
| 2009/0155936 A1 | * | 6/2009 | Weiner et al. | 438/17 |

FOREIGN PATENT DOCUMENTS

EP   1161988 B1   10/2004

OTHER PUBLICATIONS

Roth, A. Vacuum Sealing Techniques. New York: American Institute of Physics, 1994. p. 427.*

* cited by examiner

Primary Examiner — Joseph J Hail
Assistant Examiner — Arman Milanian (57) ABSTRACT

A method for combinatorially processing a substrate is provided. The method includes providing a substrate disposed on a substrate support. The substrate and the substrate support are raised against a plurality of sealing surfaces of corresponding sleeves of a plurality of flow cells of a combinatorial processing chamber. The combinatorial processing chamber is operable to concurrently process different regions of the substrate differently. A sealing pressure between the sealing surface of the sleeves and a surface of the substrate is monitored and the raising is terminated when a desired pressure is obtained. The different regions of the substrate are then processed differently.

14 Claims, 6 Drawing Sheets

METHOD AND APPARATUS FOR CONTROLLING FORCE BETWEEN REACTOR AND SUBSTRATE

BACKGROUND

Combinatorial processing enables rapid evaluation of semiconductor processes. The systems supporting the combinatorial processing are flexible to accommodate the demands for running the different processes either in parallel, serial or some combination of the two.

Some exemplary semiconductor wet processing operations include operations for adding (electro-depositions) and removing layers (etch), defining features, preparing layers (e.g., cleans), etc. Similar processing techniques apply to the manufacture of integrated circuits (IC) semiconductor devices, flat panel displays, optoelectronics devices, data storage devices, magneto electronic devices, magneto optic devices, packaged devices, and the like. As feature sizes continue to shrink, improvements, whether in materials, unit processes, or process sequences, are continually being sought for the deposition processes. However, semiconductor companies conduct R&D on full wafer processing through the use of split lots, as the deposition systems are designed to support this processing scheme. This approach has resulted in ever escalating R&D costs and the inability to conduct extensive experimentation in a timely and cost effective manner. Combinatorial processing as applied to semiconductor manufacturing operations enables multiple experiments to be performed on a single substrate.

During combinatorial experiments it is beneficial to provide as much flexibility as possible with regard to the tools performing the processing. In addition, the equipment for performing the combinatorial experiments should be designed to minimize particle generation. It is within this context that the embodiments arise.

SUMMARY

Embodiments of the present invention provide an apparatus that minimizes particle generation caused by equipment when processing a semiconductor substrate. Several inventive embodiments of the present invention are described below.

In some embodiments of the invention a method for combinatorially processing a substrate is provided. The method includes providing a substrate disposed on a substrate support. The substrate and the substrate support are raised against a plurality of sealing surfaces of corresponding sleeves of a plurality of flow cells of a combinatorial processing chamber. The combinatorial processing chamber is operable to concurrently process different regions of the substrate differently. A sealing pressure between the sealing surface of the sleeves and a surface of the substrate is monitored and the raising is terminated upon detecting a desired sealing pressure. The different regions of the substrate are processed differently.

In some embodiments of the invention, a system for combinatorial processing is provided. The system includes a reactor array comprising a pattern of site isolated reaction areas for performing a process in each reaction area. The system includes a substrate support aligned with the reactor array. The substrate support is operable to support a substrate, wherein each reaction area is formed through contact of a surface of the substrate and a sealing surface of a removable sleeve of each of the plurality of the reactor arrays. The substrate support is configured to raise the substrate and the system is operable to monitor a pressure of the surface of the substrate with the sealing surface of the removable sleeve.

Other aspects of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

The embodiments described herein provide a method and apparatus for a modular combinatorial processing system providing for control of a sealing pressure between a reactor and a substrate. It will be obvious, however, to one skilled in the art, that the present invention may be practiced without some or all of these specific details. In other instances, well known process operations have not been described in detail in order not to unnecessarily obscure the present invention.

The embodiments described below provide site isolated reactors having configurable dispense heads for combinatorial processing. The modular design enables simplified changeover to meet the demands of combinatorial processing. The system also enables adjusting the spacing of the reactors and flow cells to accommodate different substrates, die configurations, test structure locations, etc. This adjustment system can be used with the modular flow cell mentioned above or a monolithic block design in which both the reactor and the facilities interface are combined into one integral unit. The embodiments further describe a method and system where the reactor cells for the system, such as the F30 system of the assignee, where the reactor to sleeve pressure against a substrate is monitored and controlled through a computing device in order to minimize leaks from the reactor and minimize particle generation due to the abrasion of the sleeve sealing surface with the surface of the substrate.

Through the embodiments, a hard stop for the substrate support is unnecessary, and instead the pressure of the sealing surface against the substrate is considered. It should be appreciated that there is a trade off with the sealing pressure and the amount of particles generated from the abrasion of the sealing surface and the substrate surface. That is, as the sealing pressure increases past a certain value, the amount of particles generated from the abrasion begins to increase. The embodiments attempt to identify the optimum sealing pressure to prevent leaks and minimize particle generation.

Semiconductor manufacturing typically includes a series of processing steps such as cleaning, surface preparation, deposition, patterning, etching, thermal annealing, and other related unit processing steps. The precise sequencing and integration of the unit processing steps enables the formation of functional devices meeting desired performance metrics such as efficiency, power production, and reliability.

As part of the discovery, optimization and qualification of each unit process, it is desirable to be able to i) test different materials, e.g., different substrates and chemical reactants, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as integrated circuits. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single monolithic substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

HPC processing techniques have been successfully adapted to wet chemical processing such as etching and cleaning. HPC processing techniques have also been successfully adapted to deposition processes such as physical vapor deposition (PVD), atomic layer deposition (ALD), and chemical vapor deposition (CVD).

Figure 1:
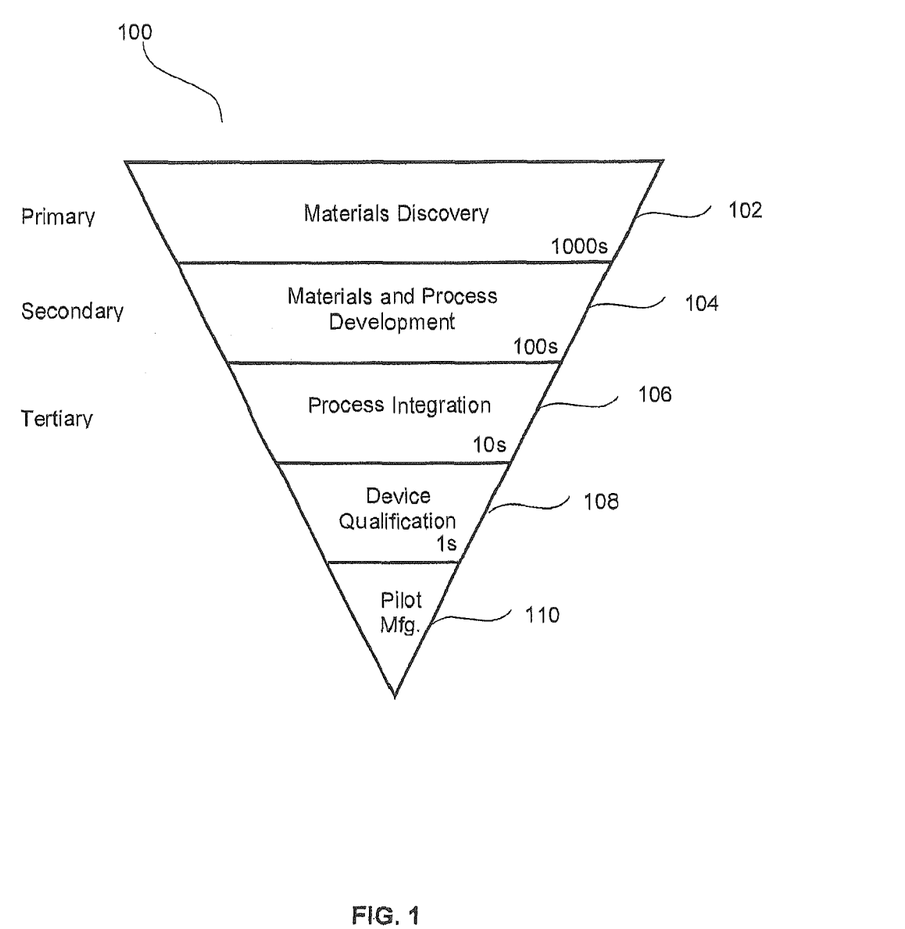
FIG. 1 illustrates a schematic diagram for implementing combinatorial processing and evaluation using primary, secondary, and tertiary screening.

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present invention. The embodiments described herein enable the application of combinatorial techniques to process sequence integration in order to arrive at a globally optimal sequence of semiconductor manufacturing operations by considering interaction effects between the unit manufacturing operations, the process conditions used to effect such unit manufacturing operations, hardware details used during the processing, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed when fabricating a device. A global optimum sequence order is therefore derived and as part of this derivation, the unit processes, unit process parameters and materials used in the unit process operations of the optimum sequence order are also considered.

The embodiments described further analyze a portion or sub-set of the overall process sequence used to manufacture a semiconductor device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate are equivalent to the structures formed during actual production of the semiconductor device. For example, such structures may include, but would not be limited to, contact layers, buffer layers, absorber layers, or any other series of layers or unit processes that create an intermediate structure found on semiconductor devices. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
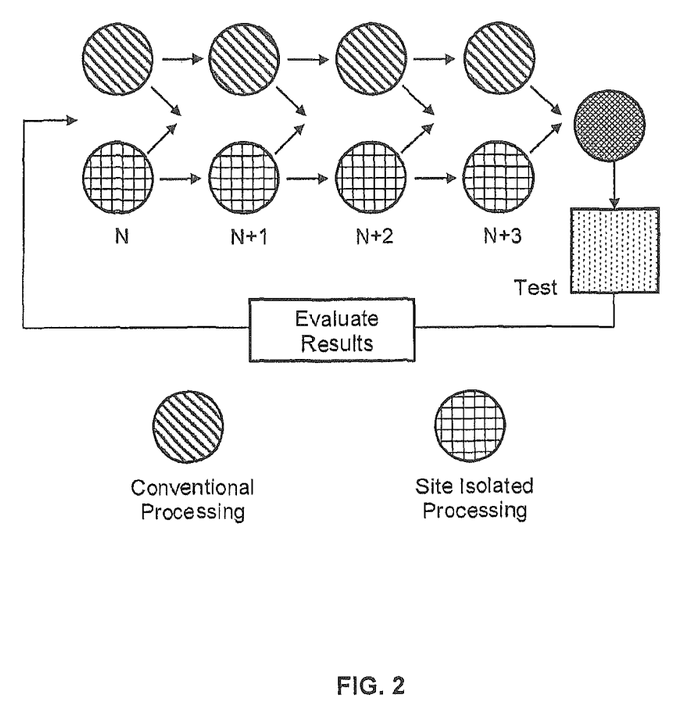
FIG. 2 is a simplified schematic diagram illustrating a general methodology for combinatorial process sequence integration that includes site isolated processing and/or conventional processing in accordance with some embodiments of the invention.

FIG. 2 is a simplified schematic diagram illustrating a general methodology for combinatorial process sequence integration that includes site isolated processing and/or conventional processing in accordance with some embodiments of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in semiconductor manufacturing may be varied.

As mentioned above, within a region, the process conditions are substantially uniform, in contrast to gradient processing techniques which rely on the inherent non-uniformity of the material deposition. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

Figure 3A:
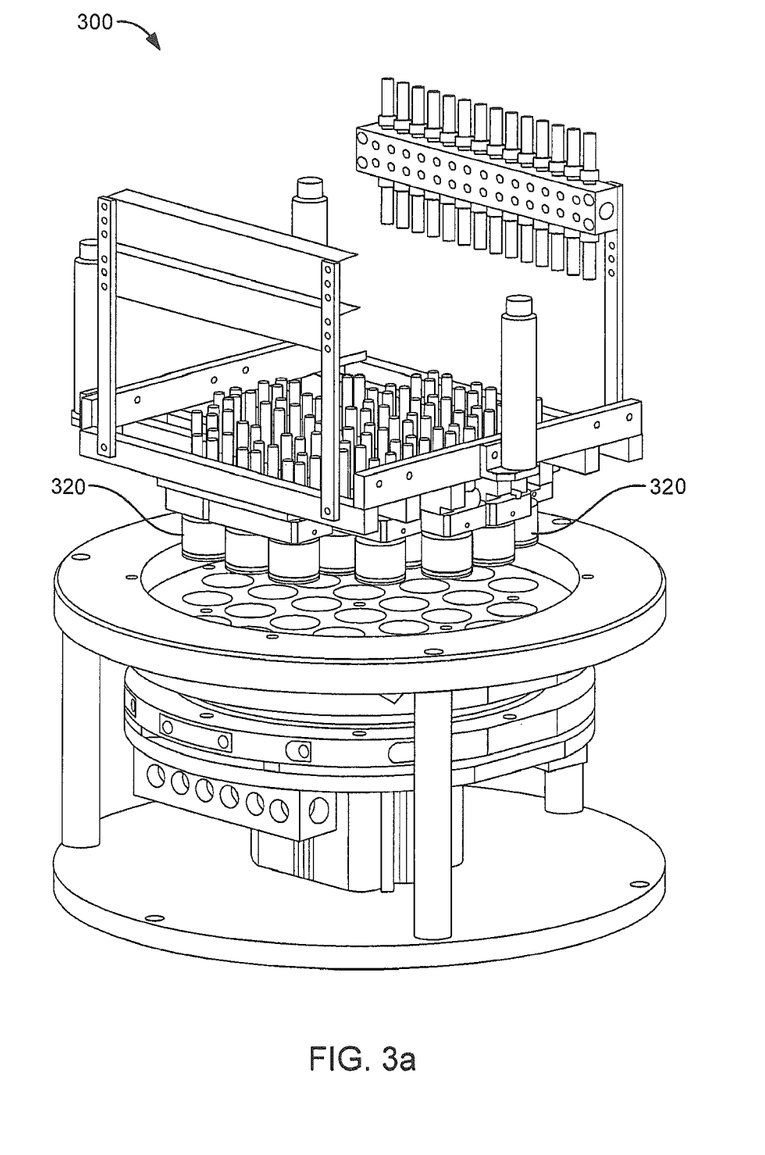
FIG. 3A is a simplified schematic diagram of a combinatorial system which may incorporate wet processing experiments or semiconductor manufacturing process sequences and unit operations in order to combinatorially evaluate various semiconductor manufacturing processes so that an optimum process may be found in a minimum amount of time in accordance with some embodiments of the invention.

FIG. 3A is a simplified schematic diagram of a combinatorial system which may incorporate wet processing experiments or semiconductor manufacturing process sequences and unit operations in order to combinatorially evaluate various semiconductor manufacturing processes so that an optimum process may be found in a minimum amount of time in accordance with some embodiments of the invention. System 300 includes a plurality of flow cells 320 which may be modular in design as in order to efficiently evaluate a plurality of processes and utilize the same tool on various programs addressing customer specific problems and enabling the use of using customer specific wafers without requiring re-tooling. In some embodiments, twenty eight flow cells are provided for twenty eight discrete regions of a twelve inch wafer. It should be appreciated that this is not meant to be limiting as any number of flow cells 320 may be accommodated on a system depending on various factors including the size and shape of the substrate being evaluated, the size of the regions on the substrate, etc. It should be appreciated that a monolithic block design is or a modular design for the flow cell 320 may be integrated with the embodiments of the invention. In addition, a rail system enabling flow cells 320 to be tailored to any pitch (e.g., spacing) of regions is provided. A flexible reactor based system is provided in addition to a static manifold system. System 300 includes a plurality of connections (not shown for illustrative purposes) distributed to each of flow cells 320. One skilled in the art will appreciate that the system of FIG. 3A may be connected to various inputs that may be affixed to system 300 through racks or external to system 300. Exemplary inputs include a dispense manifold to dispense any process fluids utilized in the system, a mix vessel for optionally mixing fluids prior to delivery to system 300, and any required power and gas inputs to operate the system. In addition, a waste collection mechanism may be in communication to receive process fluids evacuated from the reaction chambers or bypassed through flow cells 320. It should be further appreciated that while flow cells 320 are depicted as each having a certain number of inputs and outputs, the number of inputs and outputs may be varied as the illustrations are exemplary. System 300 is configured to concurrently process different regions of the substrate differently. Further details on the flow cell configuration may be found in U.S. application Ser. No. 12/333,226 entitled "Modular Flow Cell and Adjustment System" filed on Dec. 11, 2008 and claiming priority to U.S. Provisional Application No. 61/013, 038 filed on Dec. 12, 2007, both of which are herein incorporated by reference.

Figure 3B:
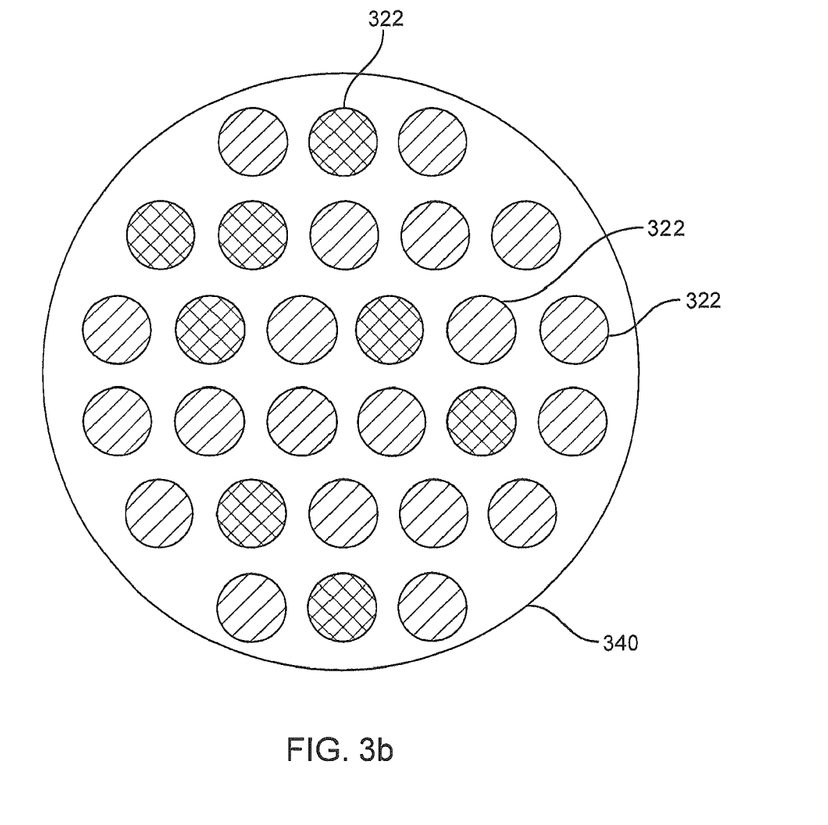
FIG. 3B is a top view of a substrate having regions processed differently through the modular head system described herein in accordance some embodiments of the invention.

FIG. 3B is a top view of a substrate having regions processed differently through the modular head system described herein in accordance with some embodiments of the invention. Substrate 340 has a plurality of regions 320, which have been combinatorially processed. Twenty eight regions are provided on substrate 340 in this exemplary embodiment. Substrate 340 is illustrated as having a substantially flat surface in this exemplary embodiment, although this is not meant to be limiting. More or fewer regions can be defined in alternative embodiments. It should be appreciated that on substrate 340 a wealth of knowledge exists on a single substrate as each of regions 320 may have some property or characteristic of the process altered. Thus, the information available for each region as well as the interaction of each region with previous or subsequent process operations or materials may be harvested to provide data on an optimum material, unit process and/or process sequence in a highly efficient manner. While FIG. 3B illustrates regions 320 as isolated and not overlapping, the regions may overlap in one embodiment. In another embodiment a region refers to a localized area on a substrate which is, was, or is intended to be used for processing or formation of a selected material. The region can include one region and/or a series of regular or periodic regions pre-formed on the substrate. The region may have any convenient shape, e.g., circular, rectangular, elliptical, wedge-shaped, etc. In one embodiment, regions 320 are predefined on the substrate. However, the processing may define the regions 320 in another embodiment.

Figure 4:
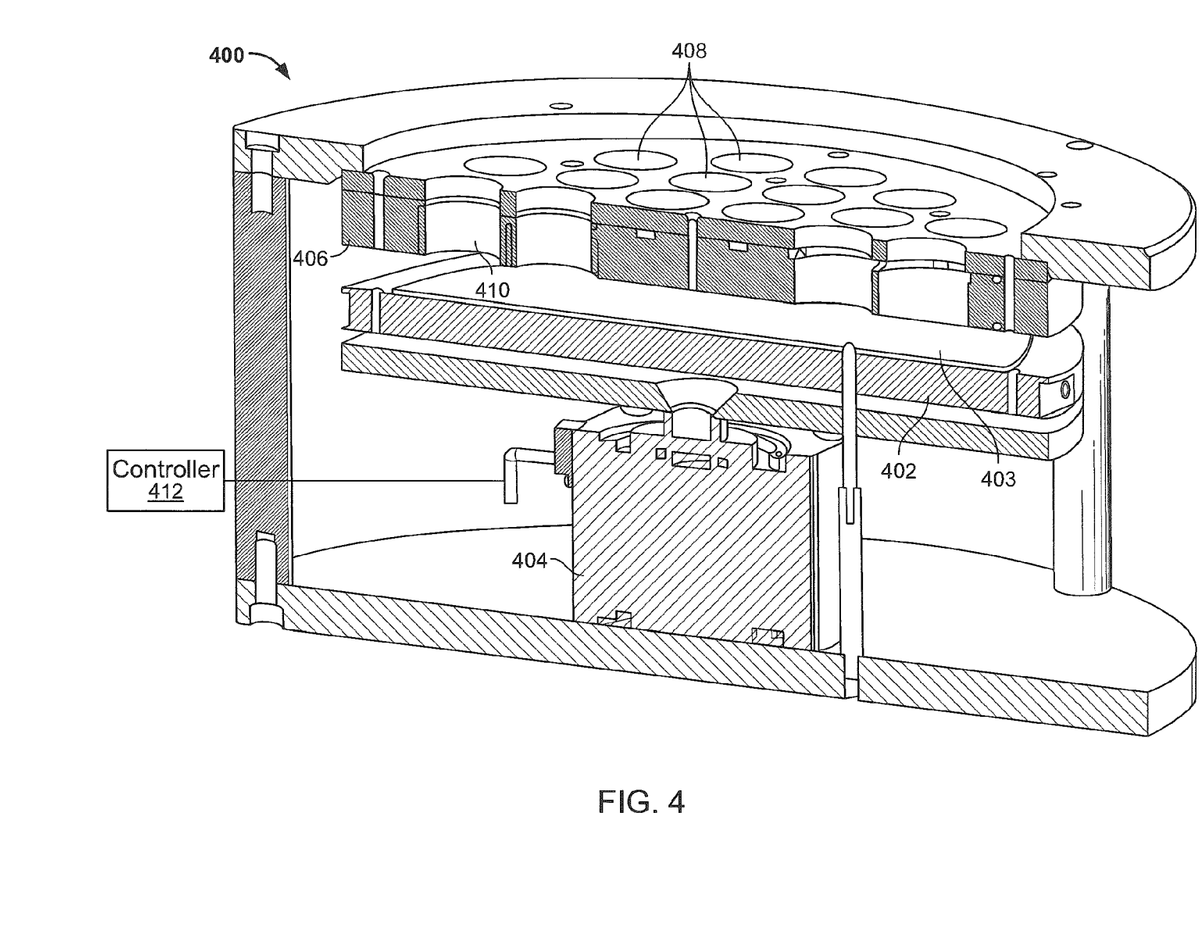
FIG. 4 is a cross sectional view of a combinatorial processing system in accordance with some embodiments of the invention.

FIG. 4 is a cross sectional view of a combinatorial processing system in accordance with some embodiments of the invention. FIG. 4 illustrates system 400 that includes a reactor block 406 disposed over stage or chuck 402 which can secure substrate 403. Reactor block 406 defines an array of reactors 408, also referred to as reaction areas, that define a pattern of isolated reaction regions when sealed against a surface of substrate 403 for performing a process in each reaction region. System 400 includes a floating or removable reactor sleeve 410. Removable reactor sleeve 410 is configured to float or be dynamically positionable in each reactor 408 of the flow cell assembly block 406 in some embodiments. Flow cell 320 of FIG. 3A may be disposed into each of reactor 408 in some embodiments. Use of the removable sleeves 410 in each reactor 408 allows for replacement of individual reactor walls that may become contaminated or otherwise unsuitable for continued use in a reactor. Piston 404 provides the force to raise substrate support 402 so that a surface of substrate 403 is forced against sealing surfaces of removable sleeves 410 in some embodiments. In some embodiments, piston 404 is a hydraulic piston. Controller 412 monitors and controls the force of the substrate 403 against the sealing surfaces. In some embodiments, the force is controlled between about 10 pounds per square inch (psi) and about 30 psi and the force is monitored at piston 404. Thus, once a desired sealing pressure is detected, controller 412 terminates the raising of the substrate support by terminating movement of the piston 404. It should be appreciated that while a greater force may be used, e.g., greater than 30 psi, the greater force results in more abrasion between the sealing surfaces of the removable sleeve 410 and the surface of the substrate 403, which in turn generates increased particles. Controller 412 may be a general purpose computer or a special purpose computer. In some embodiments, reactors 408 are independently moveable through a rail system as described in U.S. Pat. No. 8,663,977 filed Dec. 7, 2011, which is herein incorporated by reference in its entirety for all purposes.

Figure 5:
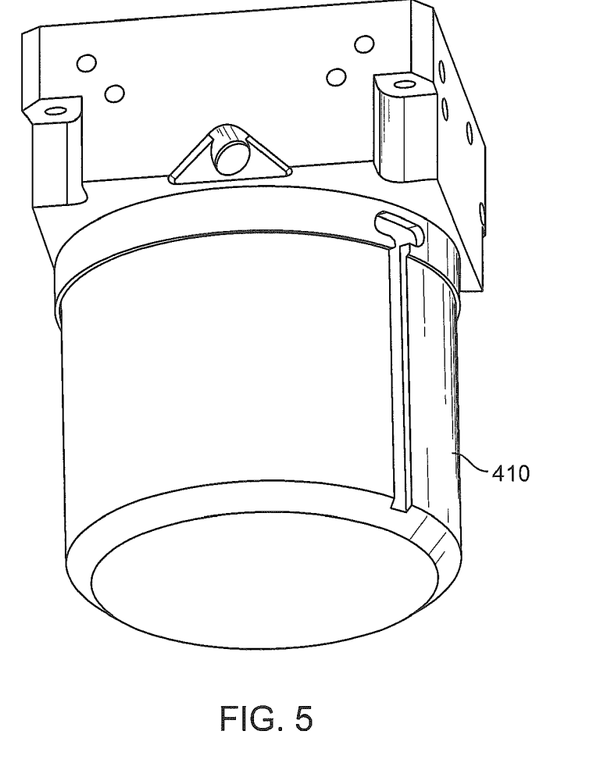
FIG. 5 is a simplified schematic diagram for a removable sleeve affixed to a bottom portion of a flow cell in accordance with some embodiments of the invention.

FIG. 5 is a simplified schematic diagram for a removable sleeve affixed to a bottom portion of a flow cell in accordance with some embodiments of the invention. A bottom surface of sleeve 410 is designed to seal with a top surface of a substrate. The minimum contact surface of sleeve 410 is configured as a knife edge in some embodiments. It should be appreciated that the seal to the top surface of the substrate may be formed from, for example, an O-ring, a flexible lip or other mechanism. Removable sleeve 410 locks to the flow cell in some embodiments so that the processing region is isolated from an external environment. In some embodiments, sleeve 410 may be formed from polytetrafluoroethylene or any suitable material compatible with the fluids used for processing and is capable forming a seal with a surface of the substrate to define site isolated reaction regions on the surface of the substrate.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A method for combinatorially processing a substrate, comprising:
   providing the substrate disposed on a substrate support;
   raising the substrate and the substrate support to form a seal between a plurality of regions of a surface of the substrate and a plurality of sealing surfaces of a plurality of flow cells of a processing chamber, the processing chamber operable to concurrently process the plurality of regions of the surface of the substrate in a combinatorial manner;
   monitoring a sealing pressure between the plurality of sealing surfaces of the plurality of flow cells and the plurality of regions of the surface of the substrate;
   terminating the raising upon detecting a desired sealing pressure; and
   processing the plurality of regions of the surface of the substrate in a combinatorial manner.

2. The method of claim 1, wherein the substrate support is raised by a piston.

3. The method of claim 1, wherein at least one of the plurality of sealing surfaces of the plurality of flow cells is a minimum contact sealing surface.

4. The method of claim 3, wherein the minimum contact surface is a knife edge.

5. The method of claim 1, wherein the monitoring is performed through monitoring of a pressure exerted by a piston raising the substrate support.

6. The method of claim 1, wherein the sealing pressure is between about 10 pounds per square inch (psi) to about 30 psi.

7. The method of claim 1, wherein the surface of the substrate is a substantially flat surface.

8. A system for combinatorially processing a substrate, comprising:
   a processing chamber comprising a plurality of isolated flow cells,
   wherein each of the isolated flow cells is operable for performing a process on a site isolated region of a surface of the substrate; and
   a substrate support aligned with the plurality of isolated flow cells, the substrate support operable to support the substrate,
   wherein each of the isolated flow cells forms a site isolated reaction region by contact between the surface of the substrate and a sealing surface of each of the the isolated flow cells,
   wherein the substrate support is configured to raise the substrate; and
   wherein the system is operable to monitor a sealing pressure between the surface of the substrate and the sealing surface of each of the isolated flow cells.

9. The system of claim 8, wherein the sealing surface of each of the isolated flow cells is a minimum contact surface.

10. The system of claim 9, wherein the minimum contact surface is a knife edge.

11. The system of claim 8, wherein a piston raises the substrate support.

12. The system of claim 11, wherein the sealing pressure is monitored at the piston.

13. The system of claim 8, wherein the plurality of isolated flow cells includes a plurality of moveable flow cells.

14. The system of claim 8, wherein the sealing pressure is between about 10 pounds per square inch (psi) to about 30 psi.

* * * * *